(12) United States Patent
Yamauchi et al.

(10) Patent No.: US 6,487,027 B2
(45) Date of Patent: Nov. 26, 2002

(54) OPTICAL SEMICONDUCTOR MODULE HAVING A CAPABILITY OF TEMPERATURE REGULATION

(75) Inventors: Yasuyuki Yamauchi, Nakakoma (JP); Toyotoshi Machida, Nakakoma (JP); Nobuhiro Ninomiya, Nakakoma (JP)

(73) Assignee: Fujitsu Quantum Devices Limited, Yamanashi (JP)

( * ) Notice: Subject to any disclaimer, the term of this patent is extended or adjusted under 35 U.S.C. 154(b) by 15 days.

(21) Appl. No.: 09/837,186

(22) Filed: Apr. 19, 2001

(65) Prior Publication Data

US 2001/0033592 A1 Oct. 25, 2001

(30) Foreign Application Priority Data

Apr. 21, 2000 (JP) ......................... 2000-121650

(51) Int. Cl.[7] ............................. G02B 7/02; G02B 6/36; H01B 3/13
(52) U.S. Cl. ............................. 359/820; 372/32; 385/92
(58) Field of Search ............................. 359/820; 372/33, 372/31, 32; 385/88, 92

(56) References Cited

U.S. PATENT DOCUMENTS 5,781,572 A * 7/1998 Tahara et al. .................. 372/34

FOREIGN PATENT DOCUMENTS

| EP | 0939470 A2 | * | 9/1999 | ........... H01S/3/133 |
| JP | 5-136513 | | 6/1993 | |
| JP | 10-79551 | | 3/1998 | |
| JP | 2000056185 A | * | 2/2000 | ............ G02B/6/42 |
| WO | WO-99/27664 A1 | * | 6/1999 | ......... H04B/10/145 |

* cited by examiner

*Primary Examiner*—Georgia Epps
*Assistant Examiner*—David N. Spector
(74) *Attorney, Agent, or Firm*—Armstrong, Westerman & Hattori, LLP

(57) ABSTRACT

An optical semiconductor device includes a package body, a laser diode accommodated in the package body, a temperature regulation block connected thermally to the laser diode, an optical filter connected thermally to the temperature regulation block, a photodetector receiving the laser beam from the laser diode via the optical filter, a feeder feeding a driving power to the laser diode, and a thermal conducting body provided separately to the feeder, wherein the thermal conducting body transmits the temperature of the package body to the laser diode.

16 Claims, 11 Drawing Sheets

6A
6B

6B

OPTICAL SEMICONDUCTOR MODULE HAVING A CAPABILITY OF TEMPERATURE REGULATION

CROSS-REFERENCE TO RELATED APPLICATION

The present application is based on Japanese priority application No. 2000-121650 filed on Apr. 21, 2000, the entire contents of which are hereby incorporated by reference.

BACKGROUND OF THE INVENTION

The present invention generally relates to optical semiconductor devices and more particularly to an optical semiconductor module having a capability of temperature regulation.

In a large-capacity optical-fiber transmission system that uses the technology of optical wavelength multiplexing for modulating optical information, it is necessary to use a large number of stabilized optical sources that produce respective optical beams with stabilized wavelengths.

Thus, it has been practiced to use an optical semiconductor module that uses a temperature regulation mechanism called wavelength-locker for the optical source of optical-fiber transmission systems, wherein the wavelength-locker uses a feedback control for maintaining the desired oscillation wavelength.

FIG. 1 shows the construction of an optical semiconductor module 10 having a conventional wavelength-locker.

Referring to FIG. 1, the optical semiconductor module 10 includes a package body 2 and a laser diode 1, wherein the laser diode 1 is mounted on the package body 2 by way of a temperature regulation block 3 provided on the package body 2 and a carrier member 4 provided further on the temperature regulation block 3. The laser diode 1 is fed with a driving current via a bonding wire 1C connected to an electrode on the package body 2 and produces an output optical beam 1A such that the optical beam 1A is injected into an end of an optical fiber coupled to an optical window 2A on the package body 2.

The laser diode 1 further produces another optical beam 1B in a direction opposite to the direction of the optical beam 1A, wherein the optical beam travels consecutively through a beam splitter 5 and an optical wavelength-filter 6 and reaches a first photodiode 7. Further, the optical beam 1B which is split by the beam splitter 5 is directed to a second photodiode 8. Further, there is provided a thermister 4A on the carrier member 4 for measurement of the temperature of the laser diode 1. The thermister 4A thereby supplies an output signal thereof indicative of the temperature of the laser diode 1 to an external control circuit provided outside the package body 2 via a bonding wire 4B and a corresponding terminal.

Further, the-optical semiconductor module 10 includes a first collimator lens (not illustrated) on the optical path of the optical beam 1A between the laser diode 1 and the window 2A, and a second collimator lens (not illustrated) is provided on the optical path of the optical beam 1B between the laser diode 1 and the beam splitter 5.

As noted previously, the optical semiconductor module 10 cooperates with an external control circuit, and the external control circuit controls the laser diode 1, in response to the output of the thermister 4A, in such a manner that the optical power of the optical beam 1B detected by the second photodiode 8 is maintained constant. In other words, the photodiode 8 forms a part of an APC (automatic power control) loop.

The external control circuit further controls, in response to the output signal of the first photodiode 7 indicative of the optical power of the optical beam 1B after being passed through the optical wavelength-filter 6, a Peltier element that constitute the temperature regulation block 3 so as to compensate for the variation of the oscillation wavelength of the laser diode 1 by changing the operational temperature thereof.

FIG. 2 shows an example of the dependence of the oscillation wavelength on operational temperature of the laser diode 1.

Referring to FIG. 2, it can be seen that the oscillation wavelength of the laser diode 1 shifts in the direction of longer wavelength side with increasing operational temperature as a result of the change of the effective length of the optical cavity and the change of the refractive index caused as a result of the temperature change.

FIG. 3 shows a transmittance curve of the optical filter 6. It should be noted that the optical filter 6 is formed of an optical medium defined by a pair of parallel surfaces such as a glass slab and has the nature of etalon.

Referring to FIG. 3, it can be seen that the transmittance curve shows a sinusoidal change with the wavelength of incoming optical beam, and thus, it becomes possible to achieve a sensitive detection of the wavelength change of the laser diode 1 by way of the photodetector 7, by designing the optical filter 6 such that the sloped region of the transmittance curve coincides with the oscillation wavelength of the laser diode 1.

In view of the fact that the output of the laser diode 1 is maintained constant as a result of the APC control achieved by using the photodiode 8, any decrease of the optical power of the optical beam 1B detected by the photodetector 7 indicates an increase of the operational temperature of the laser diode 1 according to the relationship of FIG. 2. Thus, the external control circuit controls the temperature regulation block 3 and causes a decrease of the operational temperature of the laser diode 1. Thus, the temperature regulation block 3 and the components provided thereon constitute a wavelength-locker.

Thus, the optical semiconductor module 10 of FIG. 1 successfully detects and compensates for any change of oscillation wavelength of the laser diode 1 caused by the temperature change.

On the other hand, in the case the temperature of the environment in which the optical semiconductor module 10 is used has been changed, there is a possibility that a temperature difference caused between the laser diode 1, of which temperature is regulated by the temperature regulation block 3, and other components on the temperature regulation block 3 such as the optical wavelength-filter 6, may lead to an erroneous operation of the wavelength-locker.

In more detail, because of the fact that the temperature regulation block 3 has only a finite thermal conductivity, there can be a case, when a thermal effect arising from an environmental temperature change is transferred to the temperature regulation block 3 via the package body 2, in that a temperature difference may arise between the temperature regulation block 3, and hence the laser diode 1 subjected to temperature control by the temperature regulation block 3, and the wavelength filter 6 provided on the temperature regulation block 3.

FIG. 4 shows the transmittance of the optical filter 6 at 25° C. and 75° C., wherein the continuous line represents the transmittance at 25° C. while the broken line represents the transmittance at 75° C.

Referring to FIG. 4, it can be seen that the transmittance curve for the temperature of 75° C. has been shifted in the longer wavelength side, due to the thermal expansion or change of refractive index of the filter 6, with respect to the transmittance curve for the temperature of 25° C.

Thus, there can occur a situation in the optical semiconductor module 10 of FIG. 1 in that the photodiode 7 produces an increased output power when the optical filter 6 is at the temperature of 75° C., even in such a case the temperature of the laser diode 1 is controlled properly on the carrier member 4 by the temperature regulation block 3. Thereby, the control circuit erroneously judges that the temperature of the laser diode 1 has decreased and activates the temperature regulation block 3 so as to raise the temperature of the laser diode 1. When such an erroneous activation of the temperature regulation block 3 occurs, the oscillation wavelength of the laser diode shifts from the desired wavelength λ to a longer wavelength λ'.

In order to eliminate the foregoing problem of erroneous operation of the temperature regulation block in the optical semiconductor module, there is proposed a construction in the Japanese Laid-Open Patent Publication 10-79551 in which the laser diode 1 and the optical wavelength-filter 6 are separately subjected to temperature control. However, such a construction requires two different temperature regulation blocks and has a problem of complex construction and increased power consumption.

SUMMARY OF THE INVENTION

Accordingly, it is a general object of the present invention to provide a novel and useful optical semiconductor device wherein the foregoing problems are eliminated.

Another and more specific object of the present invention is to provide an optical semiconductor device having a temperature regulation part forming a wavelength-locker that provides a precise temperature regulation even in such a case the environmental temperature has changed substantially.

Another object of the present invention is to provide an optical semiconductor device, comprising:

a package body;

a laser diode accommodated in said package body, said laser diode producing an optical beam;

a temperature regulation part connected thermally to said laser diode, said temperature regulation part having a temperature regulation element and controlling a temperature of said laser diode;

an optical filter connected thermally to said temperature regulation part, said optical filter having a transmittance curve sloped with respect to a wavelength, said transmittance curve representing a relationship between a transmittance of said optical filter and a wavelength of an optical radiation incident thereto;

a photodetection part receiving said laser beam from said laser diode via said optical filter, said photodetection part detecting an intensity of said optical beam passed through said optical filter;

a feeder feeding a driving power to said laser diode; and a thermal conducting body provided separately to said feeder, said thermal conducting body transmitting a temperature of said package body to said laser diode.

According to the present invention, a stable locking of laser oscillation wavelength is achieved for the laser diode constituting the optical semiconductor module even in such a case the environmental temperature has been changed and the effect of the environmental temperature change has reached the components constituting a wavelength locker, particularly the optical filter used for enabling detection of the oscillation wavelength change, by thermally connecting the laser diode to the external environment via the thermal conducting body and the package body. It should be noted that the thermal conducting body maintains the laser diode at a temperature close to the environmental temperature and erroneous operation of the wavelength locker is eliminated successfully.

Other objects and further features of the present invention will become apparent from the following detailed description when read in conjunction with the attached drawings.

DETAILED DESCRIPTION OF THE INVENTION

First Embodiments

Figure 5A:
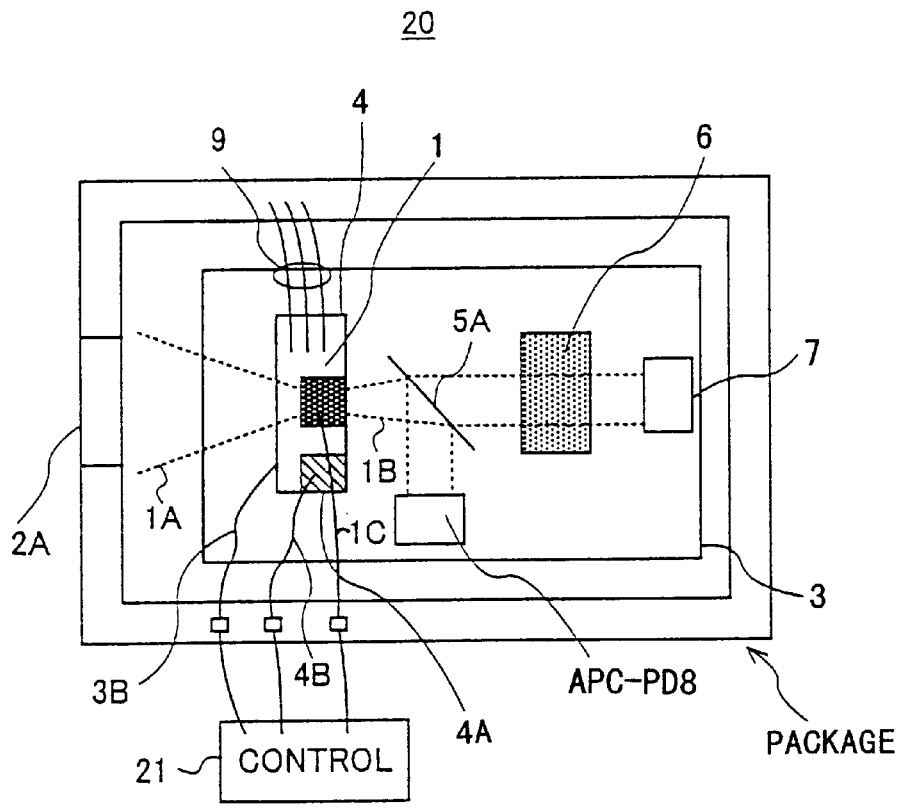
FIGS. 5A and 5B are diagrams showing the construction of an optical semiconductor module according to a first embodiment of the present invention.
Figure 5B:
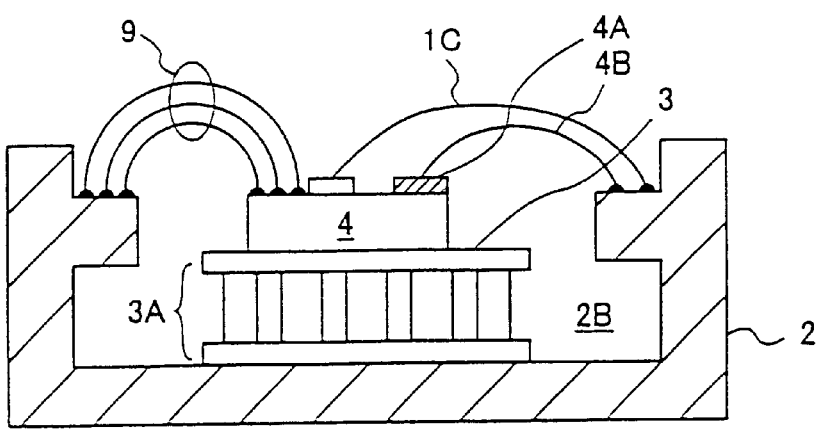

FIGS. 5A and 5B show the construction of an optical semiconductor module 20 according to a first embodiment of the present invention, wherein those parts corresponding to the parts described previously are designated by the same reference numerals and the description thereof will be omitted.

Referring to FIGS. 5A and 5B, the optical semiconductor module 20 has a construction similar to that of the optical semiconductor module 10 explained before, except that the carrier 4 is connected thermally as well as mechanically to the package body 2 by way of a number of bonding wires 9. Further, the optical semiconductor module 20 uses a parallel-plate beam splitter 5A to be explained later in place of the beam splitter 5 formed of two prisms and used in the optical semiconductor module 10.

In the optical semiconductor module 20, it should further be noted that the carrier 4, the beam splitter 5A, the optical wavelength-filter 6, and the temperature regulation block 3 on which the photodiodes 7 and 8 are supported, are all accommodated in a space 2B defined in the package body 2. The temperature regulation block 3 includes a Peltier element 3A.

FIG. 5B shows the optical semiconductor module 20 in a cross-sectional diagram as viewed from the direction of the optical window 2A. In FIG. 5B, illustration of the beam splitter 5A, the optical wavelength-filter 6 and the photodiodes 7 and 8 are omitted for the sake of simplicity. The temperature regulation block 3 includes a pair of thermally conductive metal substrates such as Al or ceramic substrates such as $Al_2O_3$ sandwiching therebetween the Peltier element 3A.

As represented in FIG. 5A, there is provided a control circuit 21 in cooperation with the optical semiconductor module 20, wherein the control circuit 21 is connected to the optical semiconductor module 20 via the bonding wire 1C for driving the laser diode 1. Further, the control circuit 21 controls the temperature of the laser diode 1 by driving the Peltier element 3A of the temperature regulation block 3 in response to the output of the thermister 4A via the bonding wire 3B.

Figure 6A:
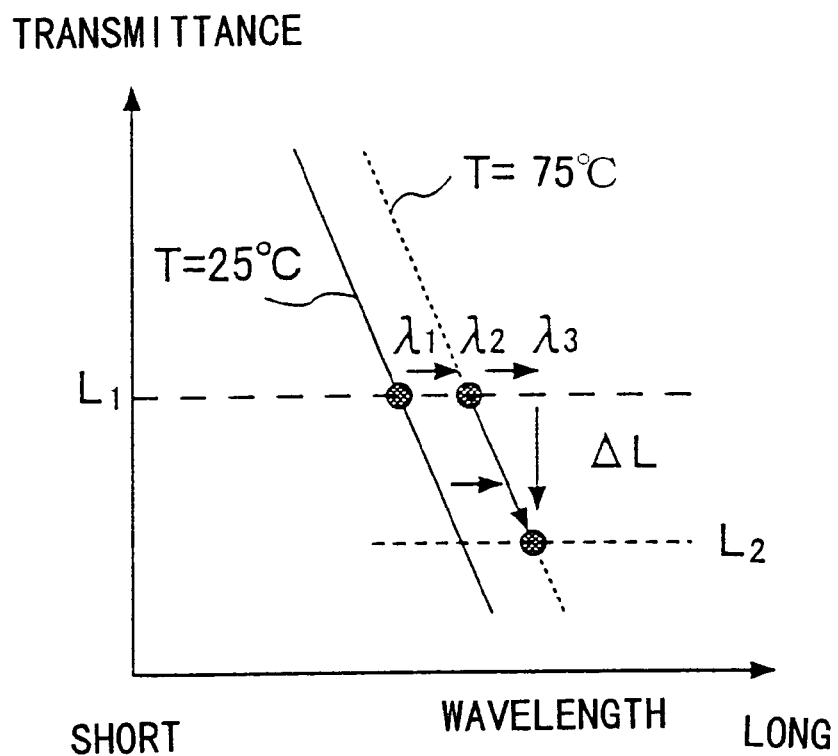
FIGS. 6A and 6B are diagrams explaining the operation of the optical semiconductor module of the first embodiment.
Figure 6B:
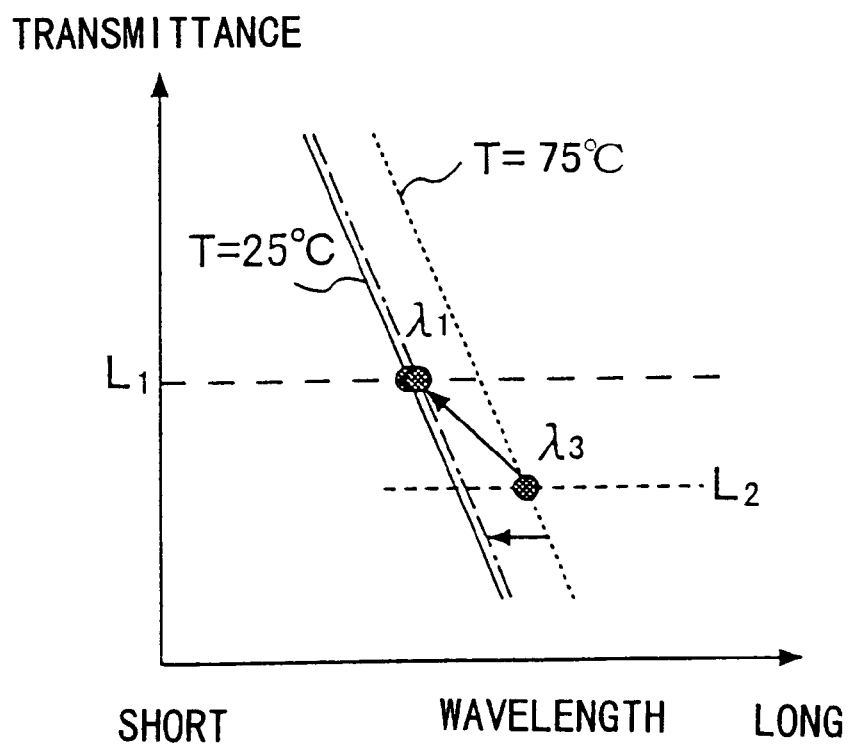

Next, the operational principle of the optical semiconductor module 20 of the present embodiment will be explained with reference to FIGS. 6A and 6B. In the explanation hereinafter, it is assumed that the optical wavelength-filter 6 has a temperature dependence of the transmittance curve as explained already with reference to FIG. 4. It should be noted that FIGS. 6A and 6B show a part of the diagram of FIG. 4 in an enlarged scale. Similarly to FIG. 4, the continuous line represents the transmittance at 25° C., while the broken line represents the transmittance at 75° C.

Referring to FIG. 6A, a temperature rise of the optical filter 6 with elevation of the environmental temperature from 25° C. to 75° C. causes a shift of the transmittance curve of the optical wavelength-filter 6 in the longer wavelength direction as represented in FIG. 6A by an arrow.

In the optical semiconductor module 20 of the present embodiment in which the carrier 4 carrying the laser diode 1 thereon is connected to the package body 2 by a number of bonding wires 9, it should be noted that the heat outside the package body 2 is transferred to the laser diode 1 via the wires 9 and there occurs a corresponding temperature rise in the laser diode 1

Figure 1:
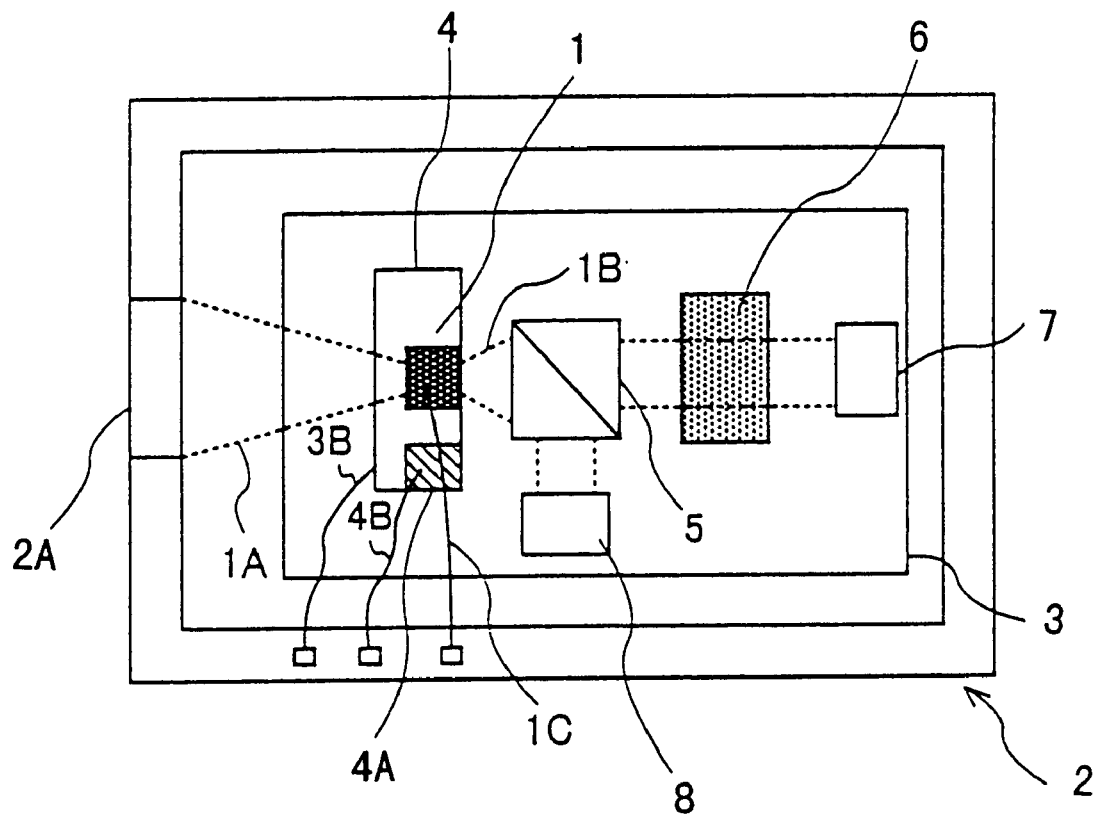
FIG. 1 is a diagram showing the construction of an optical semiconductor module according to a related art.
Figure 2:
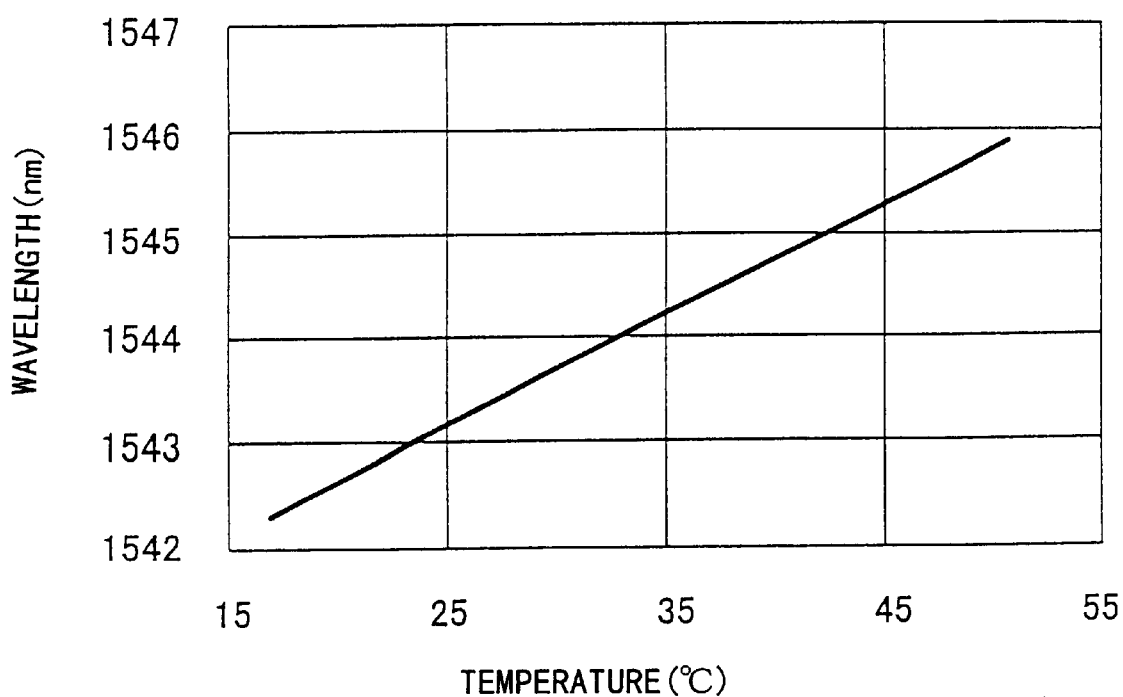
FIG. 2 is a diagram showing the temperature characteristic of a laser diode.

As the laser diode 1 has a temperature dependence explained with reference to FIG. 2, the oscillation wavelength of the laser diode 1 changes in the longer wavelength direction with the foregoing temperature rise, from the initial wavelength s, to the wavelength $\lambda_2$ and further to the wavelength 13. As a result of such a wavelength shift, the optical power of the optical beam 1B passed through the optical filter 6 undergoes a decrease $\Delta L$ from the initial level $L_1$.

This decrease $\Delta L$ of the optical power of the optical beam 1B is detected by the photodiode 7 and the control circuit 21 activates the Peltier element 3A such that the output of the photodiode 7 resumes the initial level $L_1$. As a result of such an activation of the Peltier element 3A, the carrier 4 and the laser diode 1 thereon are cooled, and the laser oscillation wavelength is shifted in the short wavelength direction from the foregoing wavelength $\lambda_3$.

Meanwhile, such a cooling mode operation of the Peltier element 3A causes a similar cooling in the optical wavelength-filter 6 via the temperature-regulating block 3. With this, the initial predetermined level $L_1$ is restored at the wavelength near the initial, predetermined wavelength 11. In other words, FIG. 6B shows the operation of a wavelength locker for recovering the predetermined laser oscillation wavelength.

Figure 4:
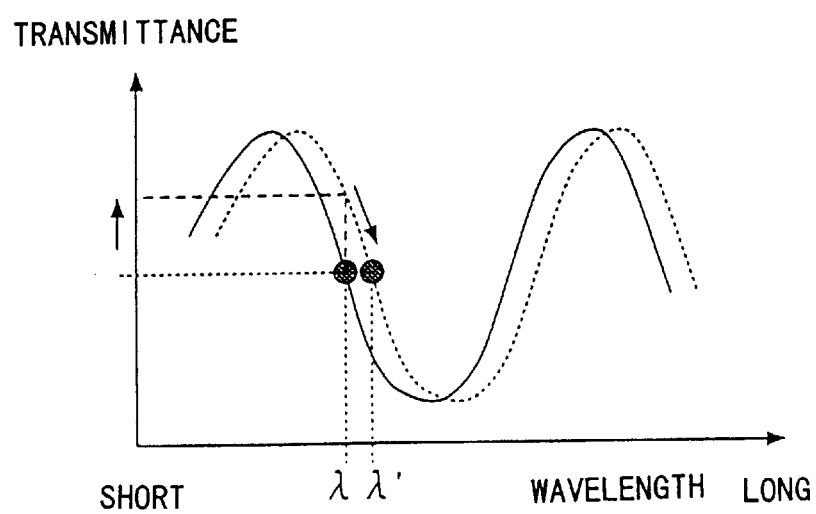
FIG. 4 is a diagram showing the transmittance of an optical filter used in the wavelength locker.

In the recovering operation of FIG. 6B, it should be noted that the cooling of the laser diode 1 occurs only slowly because of the heat transfer from the high temperature environment via the wires 9. As a result, the erroneous operation of the wavelength locker explained with reference to FIG. 4 is eliminated.

Thus, the optical semiconductor module 20 of the present embodiment successfully eliminates the problem of erroneous operation of the wavelength locker, which tends to occur when the temperature of the optical wavelength-filter 6 has been changed, by causing an intentional thermal coupling between the laser diode 1 and the package body 2, and hence the environment in which the optical semiconductor module 20 is used. By adjusting the number of the wires 9, the construction of the present embodiment can adjust the heat transfer caused therethrough as desired. Further, such wires 9 can be easily provided by using the art of wire bonding. For example, ten Au wires each having a diameter of 380 $\mu$m can provide the necessary heat transfer.

Of course, the wire 1C used for driving the laser diode 1 contributes to the heat transfer to some extent. However, such a single wire is insufficient for transferring heat from the environment to the laser diode 1. On the other hand, the wires 9 may be used also for feeding electric power to the laser diode 1.

Figure 7:
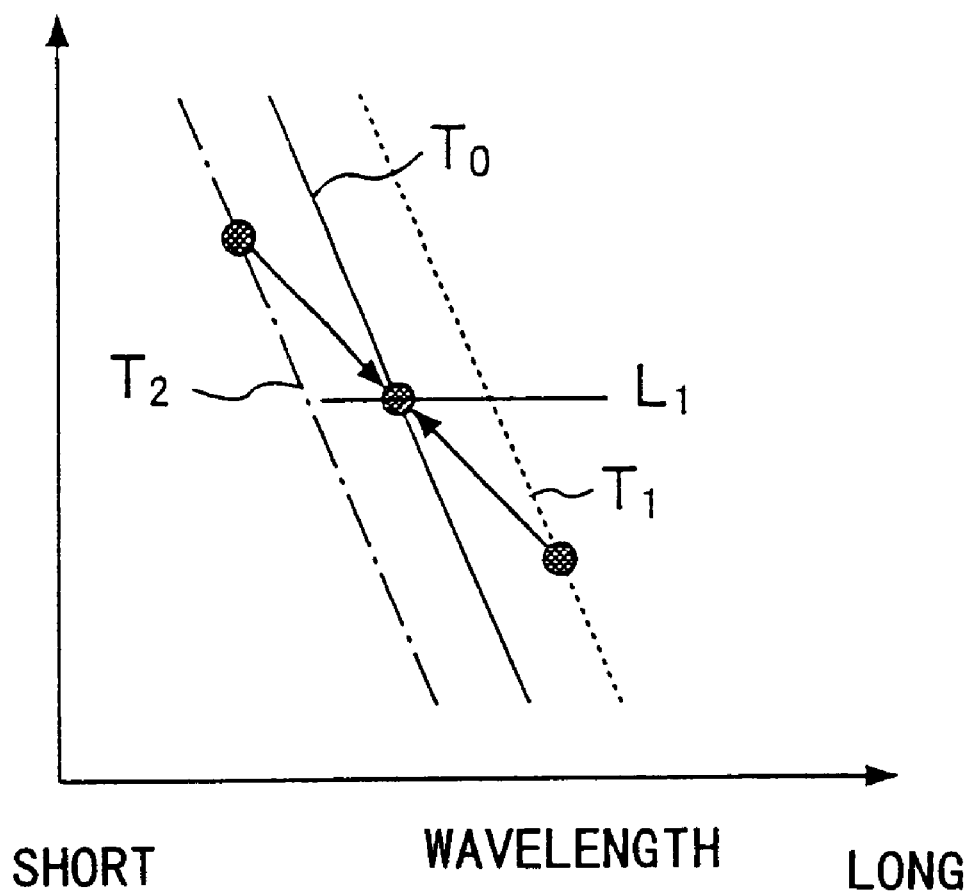
FIG. 7 is a further diagram explaining the operation of the optical semiconductor module of the first embodiment.

FIG. 7 shows the operation of the wavelength locker for the case the temperature of the optical filter 6 has changed from the predetermined temperature $T_0$ to a higher temperature $T_1$ and for the case in which the temperature has changed from the predetermined temperature $T_0$ to a lower temperature $T_2$.

In the case the temperature of the filter 6 has elevated as a result of the environmental temperature, the wavelength locker operates as explained previously. Further, a similar operation occurs also in the case the temperature of the filter 6 has decreased to the temperature $T_2$, and the Peltier element 3A is driven in a heating mode. As a result, the initial wavelength $\lambda_1$ and the initial power level $L_1$ are restored.

Figure 3:
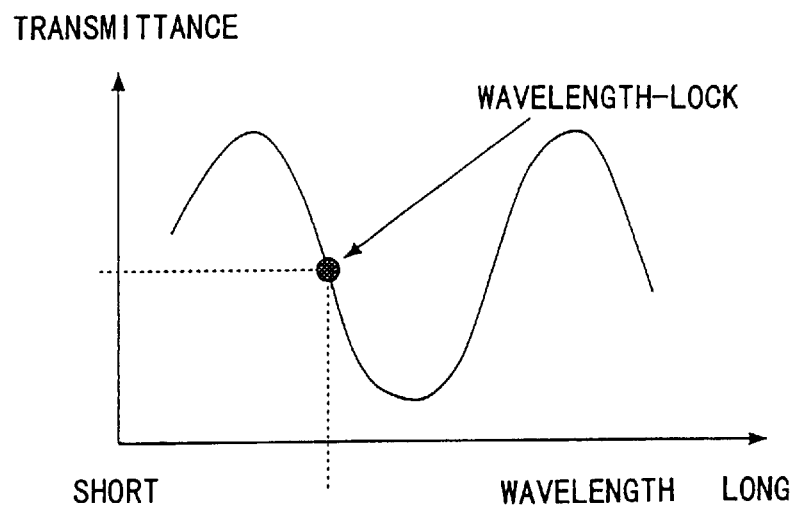
FIG. 3 is a diagram explaining the operation of a wavelength locker.
Figure 8:
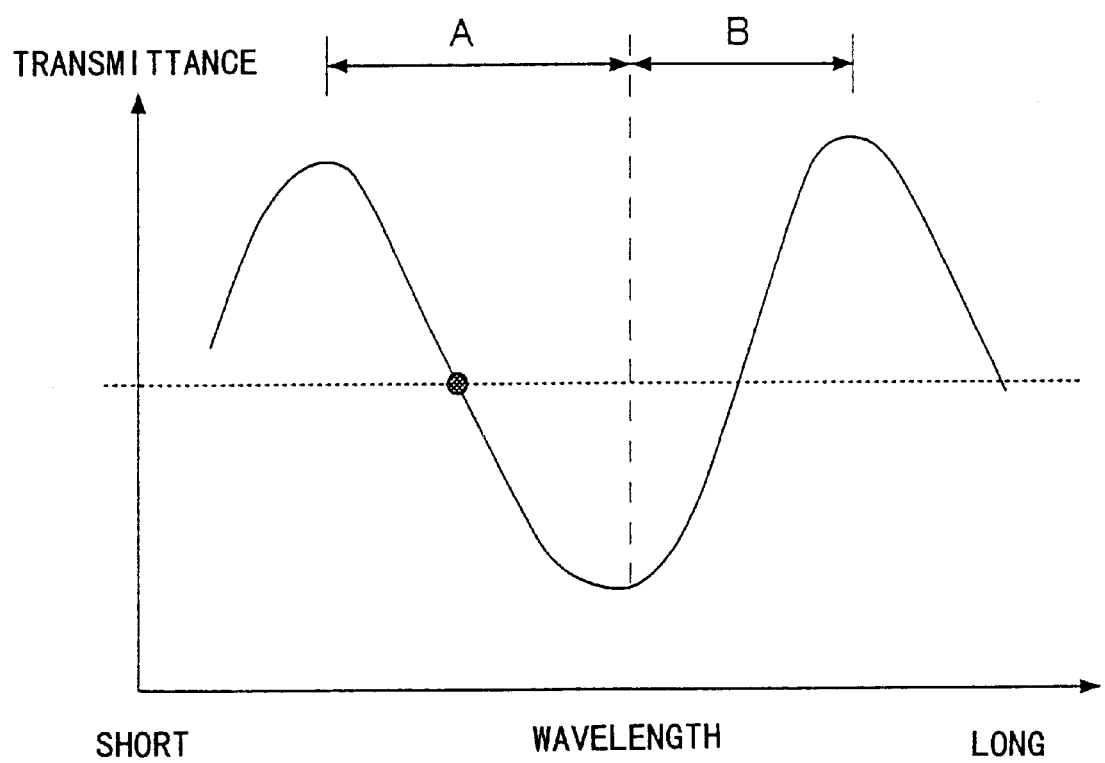
FIG. 8 is a diagram showing an operational area of the wavelength locker used in the optical semiconductor module of the first embodiment.

Meanwhile, there is a possibility in the wavelength locker of the present embodiment, in view of the fact that the optical wavelength-filter 6 has a sinusoidal transmittance curve that changes periodically with wavelength as explained with reference to FIG. 3 or FIG. 4, in that the operational point of the wavelength locker may move from a region A represented in FIG. 8, in which the transmittance curve has a negative slope, to a region B in which the transmittance curve has a positive slope. Such a situation can occur when an excessive amount of heat has been transferred from the environment via the wires 9. When this occurs and the operational point has entered the region B, the wavelength locker does not function properly anymore. It should be noted that the controller causes a heating of the laser diode 1 in the region B when the output of the photodiode 7 has decreased and a cooling when the output of the photodiode 7 has increased. This operation in the region B is exactly opposite to the operation in the region A.

From the foregoing, it is preferable that the wires 9 acting as a thermal conductor transfers heat within the range in which the nominal operation of the wavelength locker is maintained and no reversal occurs with regard to the polarity of heating and cooling.

In the construction of FIGS. 5A and 5B, it should be noted that the package body 2 is closed by a cap member not illustrated, and the laser diode 1, the temperature regulation block 3, the Peltier element 3A, the carrier 4, the thermister 4A, the beam splitter 5A, the optical wavelength-filter 6, the photodiode 7 and the photodiode 8 are sealed together with the wires 1C, 4B and 9 in a vacuum state or in a reduced pressure state. Further, the foregoing space inside the package body 2 may be filled by a gas having a thermal conductivity smaller than that of the air, such as $N_2$ or Ar. By using such a construction, penetration of heat from the environment into the optical wavelength-filter 6 is retarded and the effect of the present invention is enhanced further.

Figure 9A:
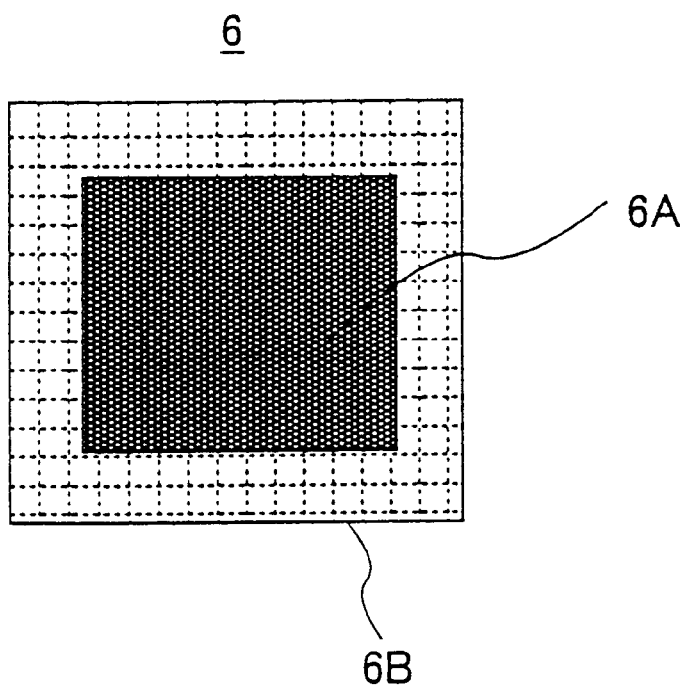
FIGS. 9A and 9B are diagrams showing the construction of an optical filter used in the optical semiconductor module of the first embodiment.
Figure 9B:
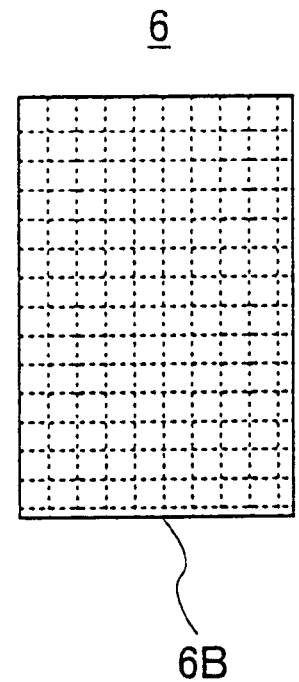

FIGS. 9A and 9B show the construction of the optical wavelength-filter 6 used in the optical semiconductor module 20 of the present embodiment respectively in a front view and in a side view.

Referring to FIGS. 9A and 9B, the optical wavelength-filter 6 comprises a multilayer filter 6A and carries thereon an infrared-reflection film (not shown) such as an $SiO_2$ film or a resin film so as to minimize the effect of the environmental temperature thereto via radiation from the package body 2. The multilayer filter 6A is held on the temperature regulation block 3 by a thermally conductive holder 6B made of a thermally conductive metal such as Al. Thereby, the efficiency of heat transfer from the Peltier element 3A to the holder 6B and hence to the filter 6 via the temperature regulation block 3 is improved, and the temperature of the filter 6 is predominantly controlled by the Peltier element 3A. Thereby, the effect of the present invention is enhanced. It is preferable that the thermally conductive holder 6B also carries an infrared-reflection coating.

Figure 10:
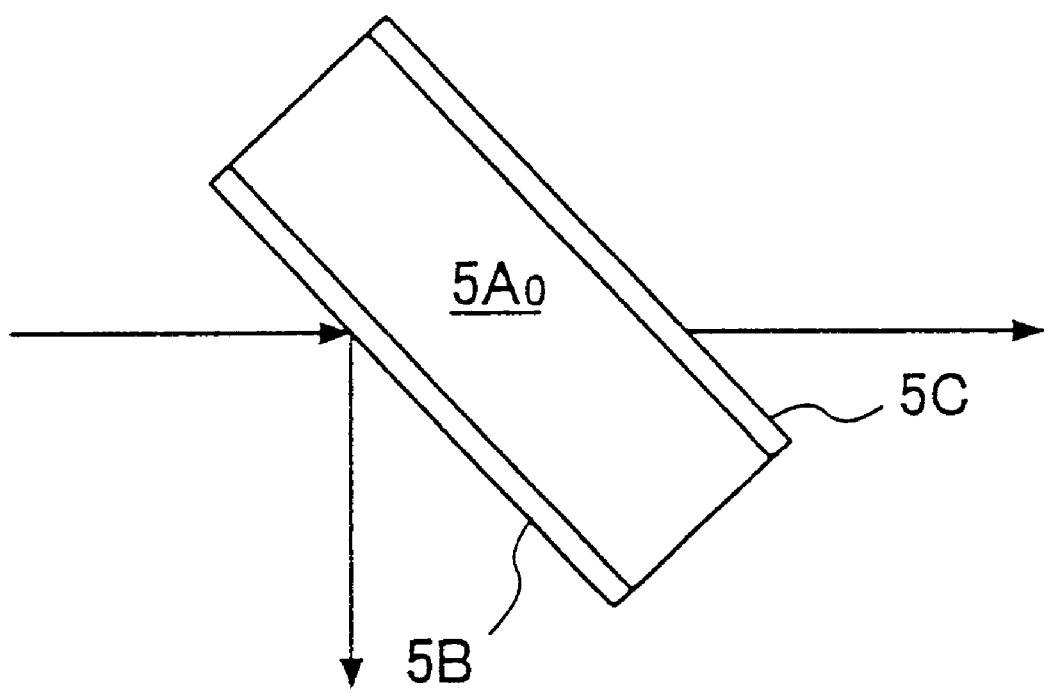
FIG. 10 is a diagram showing the construction of a beam splitter used in the optical semiconductor module of the first embodiment.

FIG. 10 shows the construction of the beam splitter 5A used in the optical semiconductor module 20 of the present embodiment.

Referring to FIG. 10, the beam splitter 5A comprises a glass slab 5Ao defined by a pair of parallel surfaces, wherein the glass slab 5Ao carries a reflection film 5B on the incident-side surface and an anti-reflection coating 5C on the exit-side surface and functions as a half mirror.

Second Embodiment

Figure 11A:
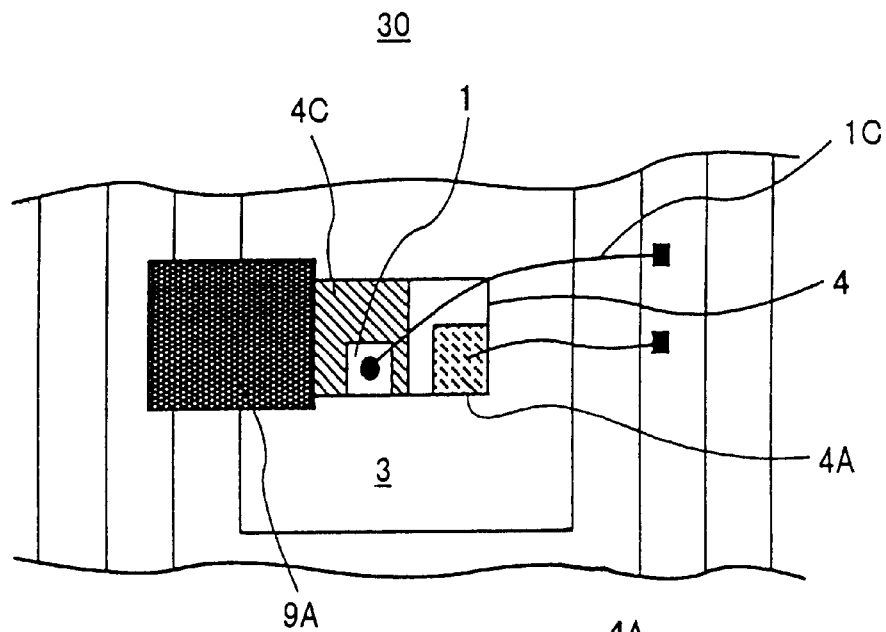
FIGS. 11A and 11B are diagrams showing the construction of an optical semiconductor module according to a second embodiment of the present invention.
Figure 11B:
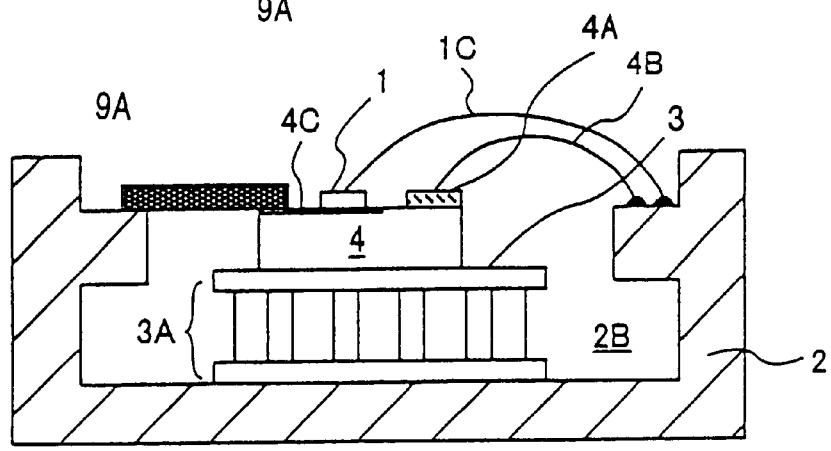

FIGS. 11A and 11B show the construction of an optical semiconductor module 30 according to a second embodiment of the present invention, wherein those parts corresponding to the parts described previously are designated by the same reference numerals and the description thereof will be omitted.

Referring to FIGS. 11A and 11B, the optical semiconductor module 30 includes a ground electrode pattern 4C on a part of the carrier 4 for electrical connection to the laser diode 1, and the laser diode 1 is mounted on such a ground electrode pattern 4C. Further, a foil or slab of a thermally conductive metal such as Al or Au is provided as a thermal conducting member 9A for thermal coupling between the package body 1 and the carrier 4, in place of the Au wires.

By using such a metal foil or slab 9A in combination with the ground electrode pattern 4C, an efficient heat transfer is guaranteed between the package body 2 and the laser diode 1 and the wavelength-locker operates with high precision.

In the present embodiment, it should be noted that an Au ribbon or Al ribbon may be used for the thermal conducting member 9A as noted above. Alternatively, the thermal conducting member 9A may be formed of an insulating film having a metal coating thereon.

Third Embodiment

Figure 12A:
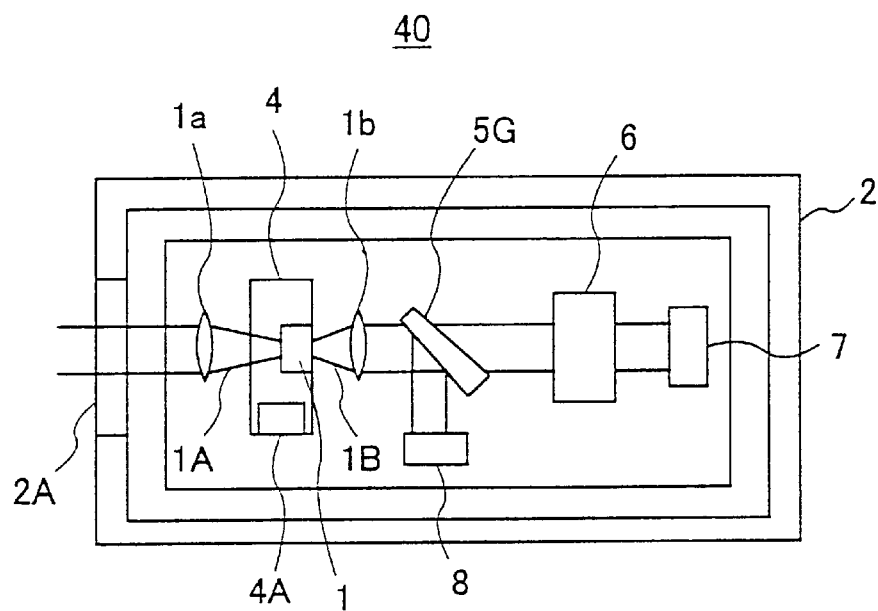
FIGS. 12A and 12B are diagrams showing the construction of an optical semiconductor module according to a third embodiment of the present invention.
Figure 12B:
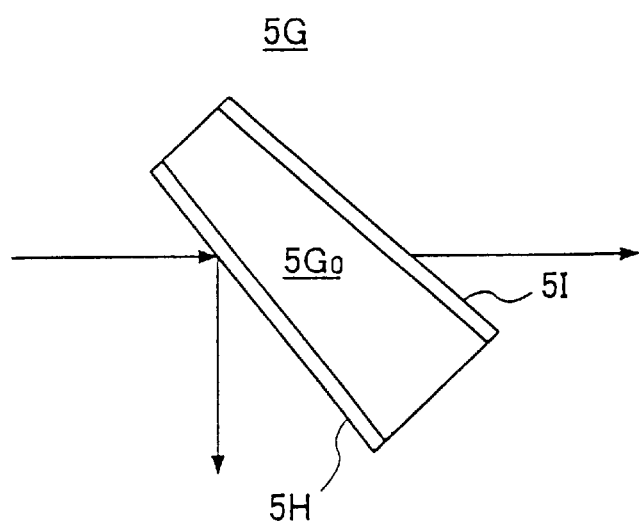

FIG. 12A shows the construction of an optical semiconductor module 40 according to a third embodiment of the present invention, while FIG. 12B shows the construction of a beam splitter 5G used in the optical semiconductor module 40 of FIG. 12A. In FIGS. 12A and 12B, those parts corresponding to the parts described previously are designated by the same reference numerals and the description thereof will be omitted.

Referring to FIG. 12A, the optical semiconductor module 40 has a construction similar to that of the optical semiconductor module 20 described previously, except that the beam splitter 5A is replaced by the beam splitter 5G of FIG. 12B. In FIG. 12A, it is noted that the optical semiconductor module 40 includes a collimator lens 1a provided in the optical path of the optical beam 1A emitted from the laser diode 1 in the forward direction and a collimator lens 1b provided in the optical path of the optical beam 1B emitted from the laser diode 1 in the backward direction. These collimator lenses 1a and 1b, however, are provided also in the optical semiconductor module 20 although not illustrated.

Referring to FIG. 12B, the beam splitter 5G is formed of a wedge shaped glass slab 5Go characterized by a pair of principal surfaces forming an angle with each other. The glass slab 5Go carries a reflection film 5H on the incident-side principal surface and an anti-reflection film 5I on the exit-side principal surface.

In the beam splitter 5G of FIG. 12B, the problem of interference of multiple-reflection beams caused between the incident-side principal surface and he exit-side principal surface is substantially eliminated as a result of the use of non-parallel relationship between the two principal surfaces, and a substantially constant transmittance can be obtained over a wide range of wavelengths.

In the case of the previous embodiment that uses the glass slab 5Ao characterized by the parallel principal surfaces for the beam splitter, the multiple reflections caused in the glass slab 5Ao tend to cause interference and the optical beam splitter shows the nature of an etalon, which is similar to the optical wavelength-filter 6. When this occurs, the optical beam incident to the wavelength-filter 6 already has an intensity that changes dependent on the wavelength, and the normal operation of the wavelength locker is inevitably affected.

By using the beam splitter 5G of FIG. 12B, it is possible to avoid such a multiple reflection of the optical beam 1B and normal operation of the wavelength locker is guaranteed. It is sufficient that the principal surfaces of the wedge-shaped beam splitter 5G intersects with an angle of as small as 0.2–10°.

It should be noted that the beam splitter 5G of the present embodiment can be used effectively in wavelength lockers of the type other than the one described heretofore that uses the optical wavelength-filter 6 for the detection of the wavelength change, as long as the wavelength-locker performs a feedback control for correcting the wavelength change. The wavelength locker may be the one that uses means other than the temperature control for controlling the optical wavelength.

It is noted that the wedge-type beam splitter itself is known from the Japanese Laid-Open Patent Publication 5-136513. However, the reference merely teaches the use of the wedge-type beam splitter only in relation to the APC control of a laser beam and not for the control of the oscillation wavelength of a laser diode. In view of the fact that the reference does not anticipate variation of laser oscillation wavelength, it is not at all obvious for a person skilled in the art to use the wedge-type beam splitter 5G for the wavelength locker for compensating for the variation of laser oscillation wavelength as described in the present invention.

Further, the present invention is by no means limited to the embodiments described heretofore, but various variations and modifications may be made without departing from the scope of the invention.

What is claimed is:

1. An optical semiconductor device, comprising:
    a package body;
    a laser diode accommodated in said package body, said laser diode producing an optical beam;
    a temperature regulation part connected thermally to said laser diode, said temperature regulation part having a temperature regulation element and controlling a temperature of said laser diode;
    an optical filter connected thermally to said temperature regulation part, said optical filter having a transmittance curve sloped with respect to a wavelength, said transmittance curve representing a relationship between a transmittance of said optical filter and a wavelength of an optical radiation incident thereto;
    a photodetection part receiving said optical beam from said laser diode via said optical filter, said photodetection part detecting an intensity of said optical beam passed through said optical filter;
    a feeder feeding a driving power to said laser diode; and
    a thermal conducting body provided separately to said feeder, said thermal conducting body transmitting a temperature of said package body to said laser diode.

2. An optical semiconductor device as claimed in claim 1, wherein said transmittance curve of said optical filter shifts in a direction of longer wavelength side with increasing temperature of said optical filter.

3. An optical semiconductor device as claimed in claim 1, wherein said thermal conducting body performs a heat transfer between said package body and said laser diode within a range in which a slope of said transmittance curve of the optical filter is not reversed.

4. An optical semiconductor device as claimed in claim 1, wherein said temperature regulation part controls a temperature thereof such that said photodetection part receives a predetermined optical power.

5. An optical semiconductor device as claimed in claim 1, wherein said thermal conducting body is used to supply a driving power to said laser diode separately to said feeder.

6. An optical semiconductor device as claimed in claim 1, wherein said thermal conducting body comprises a member selected from any of a metal wire, a metal foil, a metal slab and a metal coating provided on a base body.

7. An optical semiconductor device as claimed in claim 1, wherein said laser diode is provided on a carrier member, and said thermal conducting member is coupled thermally to said laser diode via said carrier.

8. An optical semiconductor device as claimed in claim 7, wherein said carrier member carries a ground electrode thereon and said laser diode is provided on said ground electrode, said thermal conducting body being coupled thermally to said laser diode via said ground electrode.

9. An optical semiconductor device as claimed in claim 1, wherein said optical filter carries an infrared reflection coating.

10. An optical semiconductor device as claimed in claim 1, wherein said wavelength filter is held by a thermally conductive holder, and said thermally conductive holder is provided in thermal contact with said temperature regulation part.

11. An optical semiconductor device as claimed in claim 1, wherein said laser diode, said temperature regulation part, said optical filter, said photodetection part, said feeder and said thermal conducting body are sealed in said package body in any of a reduced pressure environment, a vacuum environment or an atmosphere of a gas having a thermal conductivity smaller than the thermal conductivity of the air.

12. An optical semiconductor device as claimed in claim 1, further comprising a beam splitter between said laser diode and said photodetection part, said beam splitter dividing an optical beam incident thereto into a plurality of optical beams, said beam splitter comprising an optical medium defined by a pair of non-parallel principal surfaces, said optical beam of said laser diode being incident to one of said principal surfaces and exit from the other of said principal surfaces.

13. An optical semiconductor device as claimed in claim 12, wherein said beam splitter is provided in an optical path of said optical beam from said laser diode to said optical filter, an optical beam divided out by said beam splitter being directed to another photodetection part for output power control of said laser diode.

14. An optical semiconductor device, comprising:
    a laser diode; and
    a wavelength control part including a wavelength detection part and controlling an oscillation wavelength of said laser diode in response to an optical beam of said laser diode detected by said wavelength detection part,
    said wavelength control part including a beam splitter of an optical medium defined by a pair of non-parallel principal surfaces, said beam splitter being disposed between said laser diode and said wavelength detection part,
    said optical beam of said laser diode being incident to one of said principal surfaces and exit from one of said principal surfaces.

15. An optical semiconductor device as claimed in claim 14, wherein said wavelength detection part comprising an optical wavelength-filter having a transmittance curve and a photodetector.

16. An optical semiconductor device as claimed in claim 15, further comprising an output power controlling part controlling an output power of said optical beam produced by said laser diode, said beam splitter splitting said output optical beam of said laser diode in to a first beam incident to said wavelength detection part and a second bean incident to said output power controlling part.

* * * * *